(12) United States Patent
Foote et al.

(10) Patent No.: US 7,867,871 B1
(45) Date of Patent: Jan. 11, 2011

(54) SYSTEM AND METHOD FOR INCREASING BREAKDOWN VOLTAGE OF LOCOS ISOLATED DEVICES

(75) Inventors: Richard W. Foote, Kennedale, TX (US); Terry Lee Lines, Mansfield, TX (US); Alexei Sadovnikov, Sunnyvale, CA (US); Andy Strachan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/486,952

(22) Filed: Jul. 13, 2006

(51) Int. Cl.
H01L 21/76 (2006.01)
(52) U.S. Cl. .................. 438/439; 438/452
(58) Field of Classification Search .......... 438/442, 438/439
See application file for complete search history.

(56) References Cited

U.S. PATENT DOCUMENTS

| | | | |
|---|---|---|---|
| 5,110,756 A | 5/1992 | Gregor et al. | |
| 5,128,274 A | 7/1992 | Yabu et al. | |
| 5,369,052 A | 11/1994 | Kenkare et al. | |
| 5,614,421 A | 3/1997 | Yang | |
| 6,355,532 B1 * | 3/2002 | Seliskar et al. | 438/283 |
| 7,390,722 B1 * | 6/2008 | Foote, Jr. | 438/401 |
| 2007/0164379 A1 * | 7/2007 | Brown et al. | 257/417 |

OTHER PUBLICATIONS

Wolf, Stanley "Silicon Processing for the VLSI Era" vol. 1 2000 pp. 300-301.*
Quate Group "100-nm nMOSFET Fabrication Using Field Enhanced Oxiation of Amorphous Silicon for Gate Patterning" 1991.*
Wolf, S. "Silicon Processing for the VLSI Era" vol. 1 2nd ed. Lattice Press 2000 pp. 816-819.*
Kim et al. (Kim, Jongdae "Characteristics of P-channel SOI LDMOS Transistor with Tapered Field Oxides" ETRI Journal, vol. 21, No. 3, Sep. 1999 pp. 22-28.*
Ma et al. (Ma, T.P. "Ionizing radiation effects in MOS devices and circuits" published 1989 Wiley and Sons Inc. pp. 179 & 340).*
Webster, J "Wiley Encyclopedia of Electrical and Electronics Engineering" Copyright 1999 John Wiley & Sons, Inc pp. 744-751.*

* cited by examiner

Primary Examiner—N Drew Richards
Assistant Examiner—Grant S Withers

(57) ABSTRACT

An efficient method is disclosed for increasing the breakdown voltage of an integrated circuit device that is isolated by a local oxidation of silicon (LOCOS) process. The method comprises forming a portion of a field oxide in an integrated circuit so that the field oxide has a gradual profile. The gradual profile of the field oxide reduces impact ionization in the field oxide by creating a reduced value of electric field for a given value of applied voltage. The reduction in impact ionization increases the breakdown voltage of the integrated circuit. The gradual profile is formed by using an increased thickness of pad oxide and a reduced thickness of silicon nitride during a field oxide oxidation process.

20 Claims, 2 Drawing Sheets

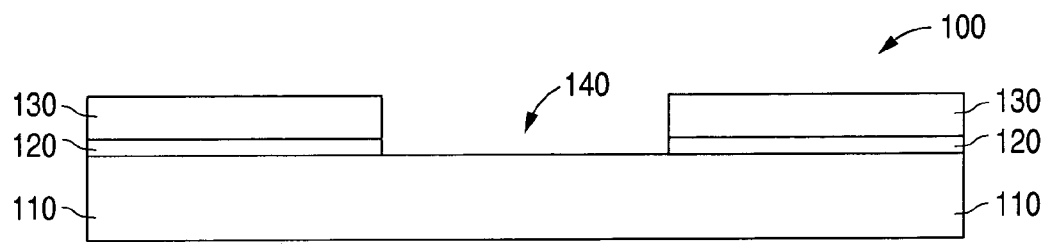
FIG. 1
(PRIOR ART)
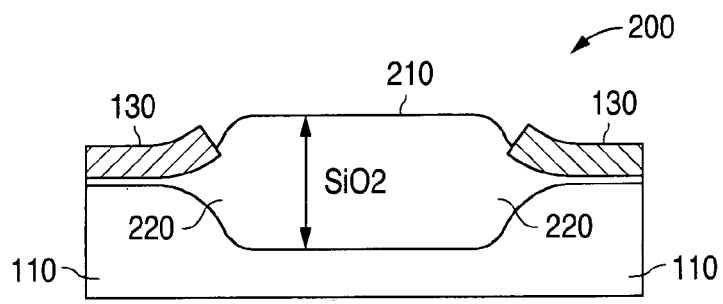
FIG. 2
(PRIOR ART)
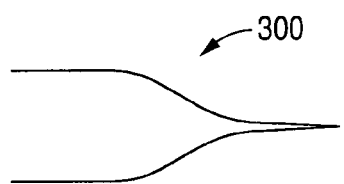 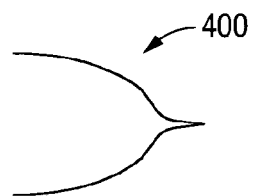
FIG. 3          FIG. 4
(PRIOR ART)    (PRIOR ART)
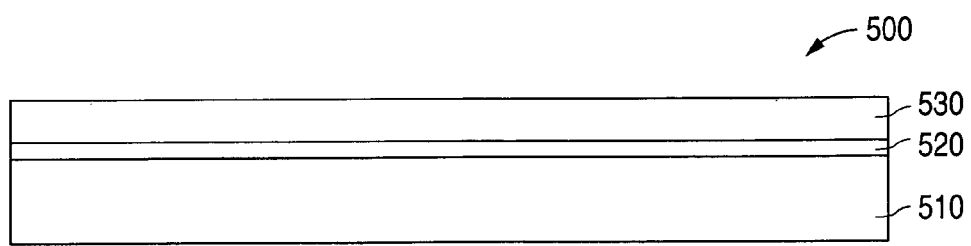
FIG. 5
(PRIOR ART)

SYSTEM AND METHOD FOR INCREASING BREAKDOWN VOLTAGE OF LOCOS ISOLATED DEVICES

CROSS-REFERENCE TO RELATED APPLICATION

This patent application is related to U.S. patent application Ser. No. 11/486,987 entitled "System and Method for Creating Different Field Oxide Profiles in a LOCOS Process" that is being filed concurrently with this patent application. This patent application and U.S. patent application Ser. No. 11/486,987 are both owned by the same assignee.

TECHNICAL FIELD OF THE INVENTION

The present invention is generally directed to semiconductor technology and, in particular, to a method for increasing the breakdown voltage of integrated circuit devices that are isolated by a local oxidation of silicon (LOCOS) process.

BACKGROUND OF THE INVENTION

In recent years, there have been great advancements in the speed, power, and complexity of integrated circuits. Large scale integrated circuits comprise thousands of devices placed on a single integrated circuit chip. A standard process for electrically isolating the devices on an integrated circuit chip is the local oxidation of silicon process (LOCOS process).

The creation of a prior art LOCOS isolation structure is illustrated in FIG. 1 and in FIG. 2. The structure 100 shown in FIG. 1 comprises a silicon substrate 110. A layer of pad oxide 120 made up of silicon dioxide ($SiO_2$) is placed on the silicon substrate 110. Then a layer 130 of silicon nitride ($Si_3N_4$) is placed on the layer pad oxide 120. A mask and etch procedure is used to etch an aperture 140 through the silicon nitride layer 130 and through the pad oxide layer 120 down to the silicon substrate 110. The application of the mask and etch procedure creates the structure 100 shown in FIG. 1.

Then the portions of the silicon substrate 110 that are exposed through aperture 140 are exposed to steam ($H_2$, $O_2$) at a relatively high temperature (e.g., one thousand degrees Celsius (1000° C.)). The oxygen in the steam oxidizes the silicon substrate 110 to form silicon dioxide ($SiO_2$). The oxidation process causes the oxidized portion of the silicon substrate 110 to increase in size.

The resulting structure 200 is shown in FIG. 2. The oxidized portion of the silicon substrate 110 is designated with reference numeral 210. As shown in FIG. 2, the oxidized portion 210 of the silicon substrate 110 is sometimes referred to as a field oxide. The field oxide 210 forms an isolation structure or isolation barrier that electrically separates and isolates portions of the integrated circuit chip.

At the edges of the field oxide 210 (near the edges of the silicon nitride portions 130) the thickness of the field oxide tapers off. The maximum thickness of the field oxide 210 (shown by double arrows in FIG. 2) gradually decreases near edges of the field oxide 210 and tapers down to the thickness of the pad oxide 120.

The tapering profile of the edges of the field oxide 210 forms a portion of the field oxide 210 that is known as a "bird's beak." The bird's beak portion of the field oxide 210 in FIG. 2 is designated with reference numeral 220.

If the bird's peak portion of the field oxide has a relatively graded slow tapering profile the resulting bird's beak profile will have the bird's peak profile 300 shown in FIG. 3. For convenience in description the bird's beak profile 300 will be referred to as a "graded" bird's beak.

If the bird's beak portion of the field oxide has a relatively short quick tapering profile the resulting bird's beak profile will have the bird's beak profile 400 shown in FIG. 4. For convenience in description the bird's beak profile 400 will be referred to as an "abrupt" bird's beak.

In prior art manufacturing processes a thick pad oxide and/or a thin silicon nitride layer will create a graded bird's beak 300. Similarly, in prior art manufacturing processes a thin pad oxide and/or a thick silicon nitride layer will create an abrupt bird's beak 400.

A significant advantage of the abrupt bird's beak is that the abrupt bird's beak takes up less lateral space than a graded bird's beak. This means that there is less space required to form the field oxide isolation structure. Therefore there is more space remaining in the integrated circuit chip for the integrated circuit devices (e.g., transistors). This concept is usually expressed by stating that the abrupt bird's beak provides a better packing density for the integrated circuit devices. A major drawback of the abrupt bird's beak is that the abrupt bird's beak has a lower breakdown voltage.

Conversely, a major advantage of the graded bird's beak is that it provides a higher breakdown voltage. But the graded bird's beak takes up more lateral space than an abrupt bird's beak. This means that the graded bird's beak has a correspondingly worse packing density in the integrated circuit chip for the integrated circuit devices (e.g., transistors).

In an integrated circuit device that is isolated by a LOCOS process it is well known that the bird's beak is one of the areas that has a high value of impact ionization. It is also well known that the presence of increased impact ionization reduces the breakdown voltage of the integrated circuit device. Therefore, in order to increase the breakdown voltage of a LOCOS isolated device, it would be desirable to decrease the amount of impact ionization in the LOCOS isolated device.

There is a need in the art for an efficient method for manufacturing an integrated circuit that has an increased breakdown voltage. In particular, there is a need in the art for a method that is capable of increasing a breakdown voltage in a LOCOS isolated device by reducing the amount of impact ionization that is present in a bird's beak of the device.

The present invention provides an efficient method for increasing the breakdown voltage in a LOCOS isolation integrated circuit device. The method comprises forming a portion of a field oxide in the integrated circuit so that the field oxide has a gradual profile. The gradual profile of the field oxide reduces the value of impact ionization in the field oxide by creating a reduced value of electric field for a given value of applied voltage. The reduction in the value of impact ionization increases the breakdown voltage of the integrated circuit.

As will be described more fully below, an advantageous embodiment of the method of the invention forms the gradual profile of the portion of the field oxide by using an increased thickness of pad oxide and a reduced thickness of silicon nitride during the field oxide oxidation process that creates the field oxide.

It is an object of the present invention to provide a method for efficiently manufacturing an integrated circuit that has an increased breakdown voltage.

It is an object of the present invention to provide a manufacturing method for an integrated circuit that increases a breakdown voltage in a LOCOS isolated device by reducing the amount of impact ionization that is present in a bird's beak of the LOCOS isolated device.

It is another object of the present invention to provide a manufacturing method for an integrated circuit that creates a gradual profile in a bird's beak field oxide in an area where it is important to have a high breakdown voltage.

The foregoing has outlined rather broadly the features and technical advantages of the present invention so that those persons who are skilled in the art may better understand the detailed description of the invention that follows. Additional features and advantages of the invention will be described hereinafter that form the subject of the claims of the invention. Persons who are skilled in the art should appreciate that they may readily use the conception and the specific embodiment disclosed as a basis for modifying or designing other structures for carrying out the same purposes of the present invention. Persons who are skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those persons of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 1 illustrates an exemplary prior art structure for illustrating a local oxidation of silicon (LOCOS) process;

FIG. 2 illustrates an exemplary prior art structure that results from applying a LOCOS process to the structure shown in FIG. 1;

FIG. 3 illustrates an exemplary profile of a prior art graded bird's beak;

FIG. 4 illustrates an exemplary profile of a prior art abrupt bird's beak;

FIG. 5 illustrates an initial stage of a method for manufacturing a prior art integrated circuit device.

DETAILED DESCRIPTION OF THE INVENTION

Figure 6:
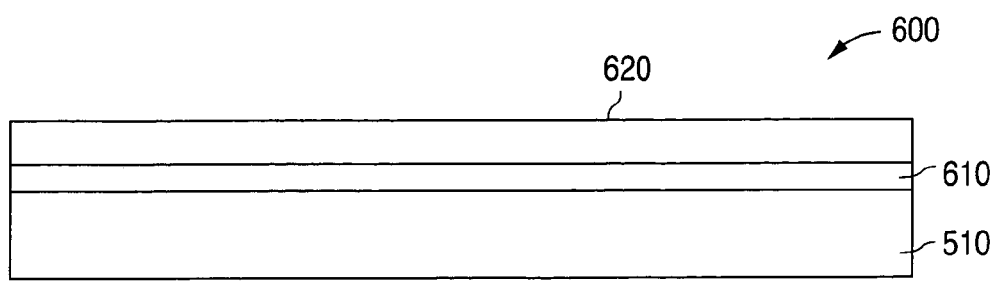
FIGS. 6 through 10 illustrate successive stages of a manufacturing method of the present invention for manufacturing an integrated circuit device of the present invention.

FIGS. 5 through 10, discussed below, and the various embodiments used to describe the principles of the present invention in this patent document are by way of illustration only and should not be construed in any way to limit the scope of the invention. Persons who are skilled in the art will understand that the principles of the present invention may be implemented in any type of suitably arranged semiconductor device.

FIG. 5 illustrates a first stage of a manufacturing method for a prior art integrated circuit device. The structure 500 shown in FIG. 5 comprises a layer of silicon substrate 510. A layer of pad oxide 520 made up of silicon dioxide ($SiO_2$) is placed on the silicon substrate 510. In a typical prior art integrated circuit device the thickness of the pad oxide 520 is approximately two hundred fifty Angstroms (250 Å). An Ångstrom is $10^{-10}$ meter.

Then a layer 530 of silicon nitride ($Si_3N_4$) is placed on the layer pad oxide 520. In a typical prior art integrated circuit device the thickness of the layer of silicon nitride 530 is approximately one thousand three hundred fifty Ångstroms (1350 Å).

The method of the present invention uses different values of thickness for the pad oxide layer and the silicon nitride layer. In particular, the method of the present invention uses an increased thickness for the pad oxide and a decreased thickness for the silicon nitride. As will be discussed more fully below, the method of the present invention creates a bird's beak that minimizes impact ionization. A decrease in the impact ionization increases the breakdown voltage of the integrated circuit device for a given value of applied voltage.

FIG. 6 illustrates a first stage of a manufacturing method of the present invention for manufacturing an integrated circuit device of the present invention. The structure 600 shown in FIG. 6 comprises a layer of silicon substrate 510. A layer of pad oxide 610 made up of silicon dioxide ($SiO_2$) is placed on the silicon substrate 510. In one advantageous embodiment of the method of the present invention the thickness of the pad oxide 610 is approximately one thousand six hundred Ångstroms (1600 Å). The 1600 Å thickness of the pad oxide 610 represents an increase of approximately one thousand three hundred fifty Ångstroms (1350 Å) over the typical prior art thickness of two hundred fifty Ångstroms (250 Å).

Then a layer 620 of silicon nitride ($Si_3N_4$) is placed on the layer of pad oxide 610. In one advantageous embodiment of the method of the present invention the thickness of the layer of silicon nitride 620 is approximately eight hundred fifty Ångstroms (850 Å). The 850 Å thickness of the silicon nitride 620 represents a decrease of approximately five hundred Ångstroms (500 Å) from the typical prior art thickness of one thousand three hundred fifty Ångstroms (1350 Å).

Figure 7:
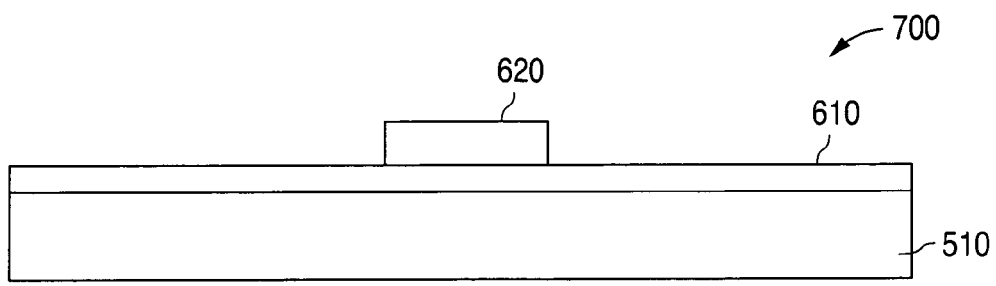

A mask and etch procedure is used to etch the layer of silicon nitride 620 away from the areas of the integrated circuit chip that will require a high breakdown voltage. The portions of the layer of silicon nitride 620 over the areas of the integrated circuit chip that will require a high packing density are left in place. The resulting structure 700 is shown in FIG. 7.

In the next step of the method of the present invention a field oxide is grown on the structure 700 by subjecting the structure 700 to steam ($H_2$, $O_2$) at a relatively high temperature (e.g., one thousand degrees Celsius (1000° C.)). The oxygen in the steam oxidizes the portions of the silicon substrate 510 that underlie the exposed portions of pad oxide layer 610 to form silicon dioxide ($SiO_2$).

Figure 8:
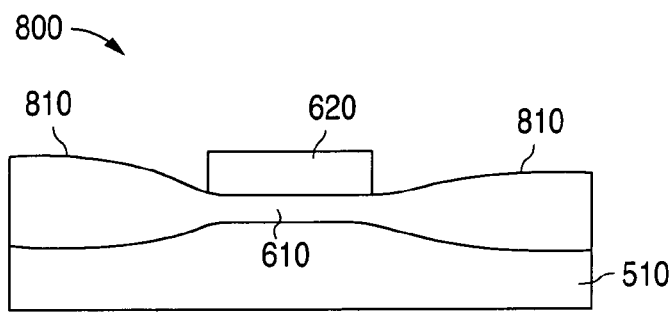

The oxidation process causes the oxidized portions of the silicon substrate 510 increase in size. The resulting structure 800 is shown in FIG. 8. The field oxide portions are designated with reference numeral 810.

During the oxidation process in the area with the relatively thick pad oxide 610 and the silicon nitride layer 620 the bird's beak profile of the field oxide 810 will have a graded and gradual profile.

Figure 9:
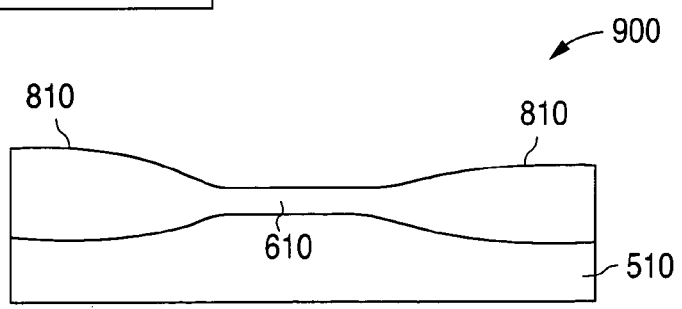

In the next step of the method of the present invention the silicon nitride layer 620 is removed. Specifically, the remaining portion of the silicon nitride layer 620 is removed from the portion of the integrated circuit that will require a high breakdown voltage. The resulting structure 900 is shown in FIG. 9.

In the last step of the method of the present invention the pad oxide layer 610 is removed. Specifically, the relatively thick pad oxide layer 610 is stripped away. The resulting structure 1000 is shown in FIG. 10.

Figure 10:
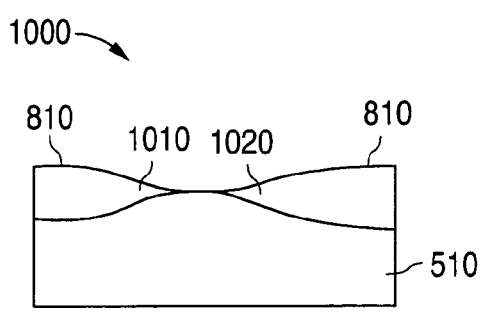

As shown in FIG. 10, the edge portions of the field oxide 810 in the portions of the integrated circuit that will require a high breakdown voltage comprise a first graded bird's beak 1010 and a second graded bird's beak 1020.

The first graded bird's beak 1010 and the second graded bird's beak 1020 each have a graded and gradual profile. The presence of a graded and gradual profile in a bird's beak minimizes the impact ionization for a given value of applied voltage. By providing a graded and gradual profile for the bird's beak structure the method of the present invention minimizes the impact ionization (for a given value of applied voltage) and correspondingly increases the breakdown voltage (for the given value of applied voltage).

One prior art method increases the breakdown voltage in an integrated circuit device by increasing the lateral distance between junctions. This type of prior art method incurs a penalty in that the device size must be correspondingly increased. Furthermore, this type of prior art method also incurs a penalty in that it increases the "on resistance" ("Rdson") of the device. The "on resistance" is the resistance between the source and the drain when the device is in an "on" condition.

The method of the present invention provides a novel and efficient method for increasing the breakdown voltage in an integrated circuit device that is LOCOS isolated. The method of the present invention gives an integrated circuit designer the flexibility to create an appropriate field oxide profile where an increased breakdown voltage is desired. Specifically, the designer can create a graded bird's beak profile in those areas where it is more important to have a higher breakdown voltage than a high packing density.

The method of the present invention creates integrated circuit chips that comprise field oxide portions that facilitate the creation of integrated circuit devices that have a high breakdown voltage.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for increasing a breakdown voltage in an integrated circuit that is isolated by a local oxidation of silicon (LOCOS) process comprising the steps of:
   placing a layer of pad oxide comprising silicon dioxide ($SiO_2$) on a silicon substrate;
   placing a layer of silicon nitride ($Si_3N_4$) on the layer of pad oxide, wherein a thickness of the layer of pad oxide is greater than a thickness of the layer of silicon nitride;
   performing a mask and etch procedure to etch the layer of silicon nitride away from areas of the integrated circuit; and
   forming a portion of a field oxide layer by oxidizing the layer of pad oxide in steam, wherein the oxidation of the layer of pad oxide and the layer of silicon nitride results in the field oxide having a gradual profile.

2. The method as set forth in claim 1 wherein said profile of said field oxide comprises a bird's beak profile.

3. The method as set forth in claim 1 wherein:
   the thickness of said pad oxide layer is approximately one thousand six hundred Ångstroms; and
   the thickness of said silicon nitride layer is approximately eight hundred fifty Ångstroms.

4. The method as set forth in claim 1 further comprising the steps of:
   removing said silicon nitride layer from said pad oxide layer; and
   removing said pad oxide layer.

5. The method as set forth in claim 1 wherein said profile of said field oxide layer reduces impact ionization in said field oxide layer by creating a reduced value of electric field in said field oxide layer for a given value of applied voltage.

6. A method for increasing a breakdown voltage in an integrated circuit, said method comprising the steps of:
   placing a layer of pad oxide comprising silicon dioxide ($SiO_2$) on a silicon substrate;
   placing a layer of silicon nitride ($Si_3N_4$) on the layer of pad oxide, wherein a thickness of the layer of pad oxide is greater than a thickness of the layer of silicon nitride;
   performing a mask and etch procedure to etch the layer of silicon nitride ($Si_3N_4$) away from areas of the integrated circuit;
   forming a bird's beak field oxide in said integrated circuit by oxidizing said integrated circuit;
   removing the silicon nitride layer from the integrated circuit; and
   removing the layer of pad oxide from the integrated circuit, wherein the integrated circuit comprise a second bird's beak.

7. The method as set forth in claim 6 further comprising the step of:
   exposing portions of said pad oxide layer and said silicon substrate under said exposed portions of said pad oxide layer to an oxidation process to create said bird's beak field oxide.

8. The method as set forth in claim 7 wherein:
   the thickness of said pad oxide layer is approximately one thousand six hundred Ångstroms; and
   the thickness of said silicon nitride layer is approximately eight hundred fifty Ångstroms.

9. The method as set forth in claim 6 wherein a profile of said bird's beak field oxide reduces impact ionization in said bird's beak field oxide by creating a reduced value of electric field in said bird's beak field oxide for a given value of applied voltage.

10. The method as set forth in claim 6 wherein said step of forming said bird's beak field oxide comprises:
    forming the pad oxide layer over the silicon substrate, wherein the thickness of the pad oxide layer is approximately one thousand six hundred Ångstroms; and
    forming the layer of silicon nitride over said pad oxide layer, wherein the thickness of the silicon nitride layer is approximately eight hundred fifty Ångstroms.

11. The method as set forth in claim 10 further comprising the step of:
    exposing portions of said pad oxide layer and said silicon substrate under said exposed portions of said pad oxide layer to an oxidation process to create said bird's beak field oxide.

12. The method as set forth in claim 10 wherein a profile of said bird's beak field oxide reduces impact ionization in said bird's beak field oxide by creating a reduced value of electric field in said bird's beak field oxide for a given value of applied voltage.

13. The method as set forth in claim 4 wherein said profile of said field oxide comprises a bird's beak profile.

14. The method as set forth in claim 1 wherein:
the thickness of the pad oxide layer is approximately one thousand six hundred Ångstroms.

15. The method as set forth in claim 1 wherein:
the thickness of the silicon nitride layer is approximately eight hundred fifty Ångstroms.

16. The method as set forth in claim 14, further comprising the step of:
removing the silicon nitride layer from the pad oxide layer.

17. The method as set forth in claim 16, further comprising the step of:
removing the pad oxide layer.

18. The method as set forth in claim 17, wherein the profile of the field oxide layer reduces impact ionization in the field oxide layer by creating a reduced value of electric field in the field oxide layer for a given value of applied voltage.

19. The method as set forth in claim 15, further comprising the step of:
removing the silicon nitride layer from the pad oxide layer.

20. The method as set forth in claim 19, further comprising the step of:
removing the pad oxide layer.

* * * * *